United States Patent [19]

Davies et al.

[11] 4,406,710
[45] Sep. 27, 1983

[54] MASK-SAVING TECHNIQUE FOR FORMING CMOS SOURCE/DRAIN REGIONS

[76] Inventors: Roderick D. Davies, 1203 Chesterton Dr., Richardson, Tex. 75080; David B. Scott, 4524 Cleveland, Plano, Tex. 75075

[21] Appl. No.: 311,684

[22] Filed: Oct. 15, 1981

[51] Int. Cl.³ .................. H01L 21/265; B01J 17/00
[52] U.S. Cl. .................................... 148/1.5; 29/571; 29/576 B; 148/187; 357/91
[58] Field of Search ............... 148/1.5, 187; 29/571, 29/576 B; 357/91

[56] References Cited

U.S. PATENT DOCUMENTS

| | | | |
|---|---|---|---|
| 3,920,481 | 11/1975 | Hu | 148/1.5 |
| 4,108,686 | 8/1978 | Jacobus, Jr. | 148/1.5 |
| 4,244,752 | 1/1981 | Henderson, Sr. et al. | 148/1.5 |
| 4,306,916 | 12/1981 | Wollesen et al. | 148/1.5 |
| 4,315,781 | 2/1982 | Henderson | 148/1.5 |
| 4,335,504 | 6/1982 | Lee | 29/576 B |

OTHER PUBLICATIONS

Fair, R. B., Solid State Electronics, 17 (1974), 17 Beanland in Ion Implantation in Semiconductors, 1976, ed. Chernow et al., Plenum, N.Y., 1977, p. 31.

*Primary Examiner*—Upendra Roy

[57] ABSTRACT

CMOS source/drain regions of both conductivity types are formed using only a single masking step. One dopant is applied to both types of source/drain regions, and a second dopant is applied at a much higher dose and energy to only one type of source/drain region.

Preferably, boron and arsenic are used as the dopants in silicon, since the cooperative doping effect causes the boron in the counterdoped source/drain regions to be entirely contained within the arsenic diffusion.

10 Claims, 4 Drawing Figures

MASK-SAVING TECHNIQUE FOR FORMING CMOS SOURCE/DRAIN REGIONS

BACKGROUND OF THE INVENTION

The present invention relates to an improvement in CMOS processing technology, whereby a masking step is saved.

Typically, CMOS processing requires at least four masking steps in addition to those used for NMOS processing, which imposes a great economic disadvantage on CMOS technology. The standard NMOS mask sequence is: (1) Moat (2) threshold-voltage ion implant (3) polysilicon (4) second contact (5) metal (6) POR (Protective Overcoat Removal). By contrast, the normal CMOS process requires at least four additional masks, as follows: (1) Tank (2) moat (3) channel stop (to do channel stopping only between N-channel devices) (4) threshold voltage ion implant (5) polysilicon (6) P+ (for low-sheet-resistance source/drain regions for P channel devices) (7) N+ (source/drain regions for N-channel devices) (8) second contact (9) metal (10) POR.

Thus, it is an object of the present invention to provide a more economical process for fabrication of CMOS devices.

It is a further object of the present invention to provide a process for fabrication of CMOS devices which reduces the number of masking steps required.

One possible way to save a masking step in CMOS processing might be to economize on the two separate masks normally required for the P-type and N-type source/drain regions. However, to do this successfully, it is necessary to find ways to obtain good control of both types of source/drain regions.

It is thus a further object of the present invention to provide a method for formation of both P-type and N-type source/drain regions using only one masking step, while retaining good control of the characteristics of the regions formed.

CMOS processes of varying complexity may be used for fabricating different types of devices. For example, the interconnect technology required for a memory array may be quite simple, whereas that required for a random logic structure (e.g., a microprocessor) may be more complex, and require additional patterned levels. Since acceptance of the simplest processes will also imply economic benefits for the more complex processes, a mask-saving scheme should preferably apply to any CMOS process, whether simple or complex.

It is thus a further object of the present invention to provide a mask-reduction scheme which applies to any CMOS process, whether simple or complex.

SUMMARY OF THE INVENTION

The present invention uses counterdoping to permit use of a single masking step for both N-type and P-type source/drain regions. Thus, the N-type source/drain regions only may be exposed to a first ion implant, and the masking then dissolved. A second implant is then applied to both types of source/drain regions.

However, such a scheme, if it relies on merely numerical dominance of one of the two dopants applied, does not permit optimal control of the characteristics of the source/drain regions where both implants have been applied. In particular, the diffusion constant of the minority dopant must be less than that of the majority dopant, or else a thin layer of opposite conductivity type will be formed adjacent to the counter doped source/drain region.

In the preferred embodiment of the present invention, a cooperative doping effect is used to greatly facilitate accurate control over the characteristics of counterdoped source/drain regions. It was discovered in bipolar devices that attempts to form double—diffused devices, using boron and arsenic as the dopants, produced base widths narrower than had been expected. It has since been discovered that the diffusivity of boron is greatly suppressed by the presence of arsenic. This effect is applied to great advantage in the present invention. By using boron and arsenic respectively for minority and majority counter dopants, the diffusivity of the boron is suppressed by the presence of arsenic in the counterdoped source/drain regions. Thus, when the implants are activated, the arsenic diffuses to form an N+ source/drain region of the desired configuration, whereas the boron in the N+ region remains approximately within its area of implantation. Thus, very good control is maintained.

To prevent the boron from forming a localized compensation within the counterdoped region, the dose of arsenic is preferably approximately five times as high as the dose of boron. This in turn implies that the conductivity of the P-type source/drain regions will be rather low. Thus, application of metal silicide layers over source and drain regions, while not necessary to practice the invention, will often be desirable to reduce series resistance. The relevance of siliciding techniques is extensively discussed in U.S. patent application No. 092,009 (Al Tasch, et al, Metal-Oxide Semiconductor Device Using Metal Silicide Regions to Improve Device Speed and Packing Density) of common assignee, which is hereby incorporated by reference.

According to the present invention, there is provided a method for forming respective CMOS source/drain regions of first- and of second-conductivity-type in respective desired locations in a semiconductor surface, comprising the steps of:

a. implanting a first-conductivity-type dopant in the respective desired locations of said first-conductivity-type sources and drains; and b. implanting a second-conductivity-type dopant in the respective desired locations both of said first-type and of second-type sources and drains, said second-type dopand being applied at a lower dose than said first-type dopant; said respective first-type and second-type dopants being selected such that the presence of said second-type dopant within said semiconductor surface reduces the diffusivity of said first-type dopant.

BRIEF DESCRIPTION OF THE DRAWINGS

The present invention will now be more specifically described with reference to the accompanying drawings, wherein.

DESCRIPTION OF THE PREFERRED EMBODIMENTS

Figure 1:
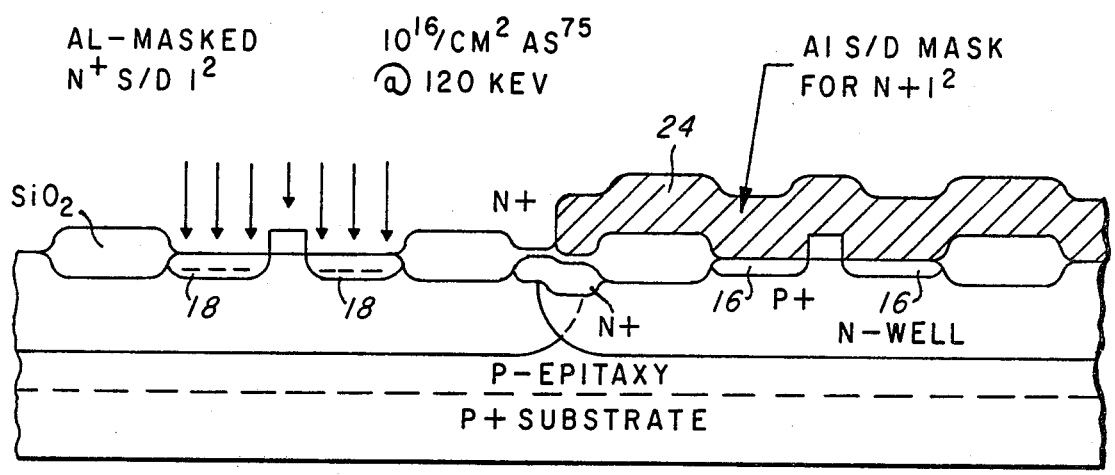
FIG. 1 shows a section of a silicon CMOS device, wherein arsenic is being implanted into only the N-type source/drain regions in accordance with the present invention.
Figure 2:
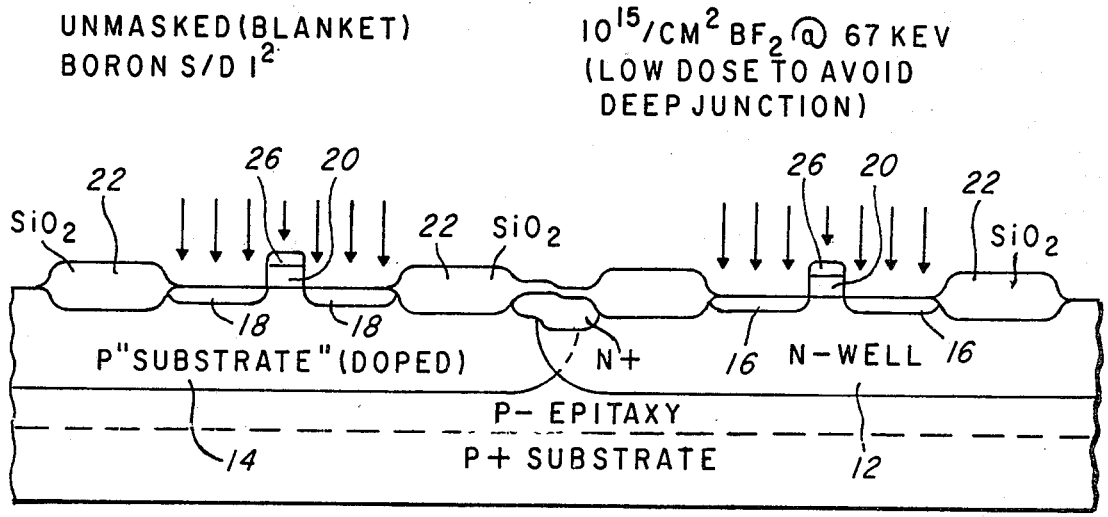
FIG. 2 shows a schematic section of a silicon CMOS device, wherein boron is being implanted into both N-type and P-type source/drain regions in accordance with the present invention.

A silicon CMOS device to which the method of the present invention is applied is shown schematically in FIG. 1. A P-channel device 12 and an N-channel device 14 are shown, respectively including regions 16 wherein P-type source/drains must be formed and regions 18 where N-type source/drains must be formed. Gate-regions 20 and oxide regions 22, etc., are also shown atop the surface.

In the presently preferred embodiment, an arsenic implant is first applied to N-type source/drain regions 18, and a boron implant is then applied to both the N-type source/drain locations 18 and to the P-type source/drain regions 16.

Mask 24 is applied over the P-type source/drain locations 16. In the preferred embodiment, aluminum is used for the mask 24. This is because the application of a heavy arsenic implant frequently has a strong hardening affect on conventional resists, making them very difficult to remove subsequently. Specifically, 500 nm of Al is preferably deposited. AZ resist is then spun on, the resist is exposed above the N-type source drain regions 18, the exposed resist is ashed and baked, and the aluminum is then wet etched in leach (phosphoric and acetic acid) followed by a clean-up solvent.

An arsenic implant is then applied to only the N-type source/drain regions 18. Preferably, the arsenic is applied at a dose of $10^{16}$ per cm$^2$ at an energy of 120 KeV. Thus, not only is the arsenic applied at a five times higher dose than the boron, it is also applied at an effective energy which is almost ten times higher.

The aluminum is then stripped by a conventional aluminum etch such as "leach" solution (followed by clean-up), and the boron is implanted in both the N-type regions 18 and the P-type regions 16.

Preferably, the boron is implanted at a very low energy. To facilitate accurate control of such a low-energy implantation, boron fluoride is preferably used. The 67 KeV energy of the BF$_2$ implant is approximately equivalent to a 14 KeV energy implant of pure boron, and is more convenient for use with conventional processing equipment. The preferred dose of the boron implant is $2 \times 10^{15}$/cm$^2$. Thus, the boron is implanted, not only at a relatively low dose, but also at a low energy.

A boron dose of $10^{15}$/cm$^2$ has been actually used in testing the process of the present invention, but this low dose causes a high sheet resistance in the P-type source/drain regions formed (about 200 ohms per square). Thus, increasing the boron dose, to the extent possible without causing localized compensation in the N-type source/drain regions, is desirable. A boron dose of $2 \times 10^{15}$/cm$^2$ will safely increase conductivity, and doses as high as $4 \times 10^{15}$/cm$^2$ appear practical. (At such higher doses, the respective implant energies and thermal treatments are optionally modified. For example, a short anneal of the arsenic implant may be performed before the boron implant.) At a dose of $2 \times 10^{15}$/cm$^2$, the P-type source/drains have a sheet resistance of about 120 ohms per square, whereas the N-type regions have a sheet resistance of about 20 ohms per square. Increasing the arsenic dose permits an even heavier boron dose to be used, but this would also create deeper N-type source/drains, increasing parasitic capacitance and leakage current and degrading device performance. In addition, arsenic doses above about $1.5 \times 10^{16}$ per cm$^2$ are ineffective, due to the limits of solid solubility. Thus, a boron dose between $5 \times 10^{14}$/cm$^2$ and $5 \times 10^{15}$/cm$^2$, at an arsenic dose of approximately $10^{16}$/cm$^2$, is deemed to be within the scope of the present invention. Moreover, a boron dose of $5 \times 10^{14}$/cm$^2$ to $10^{16}$/cm$^2$, at an arsenic dose of $5 \times 10^{15}$/cm$^2$ to $2 \times 10^{16}$/cm$^2$, is also deemed to be within the scope of the present invention. A boron effective implant energy of 10–30 KeV is also deemed to be within the scope of the invention.

Clean-up follows the boron implant, and 50 nm of oxide is deposited on the regions 16 and 18 by a conventional plasma-assisted CVD process. After further clean-up, densification of the oxide is accomplished by 30 minutes in steam at 700° C. Finally, the wafer is annealed in argon for 20 minutes at 1000° C.

By these steps, the implanted source/drain regions are activated. CMOS processing then proceeds with further conventional steps to form a desired configuration of CMOS devices.

Figure 3:
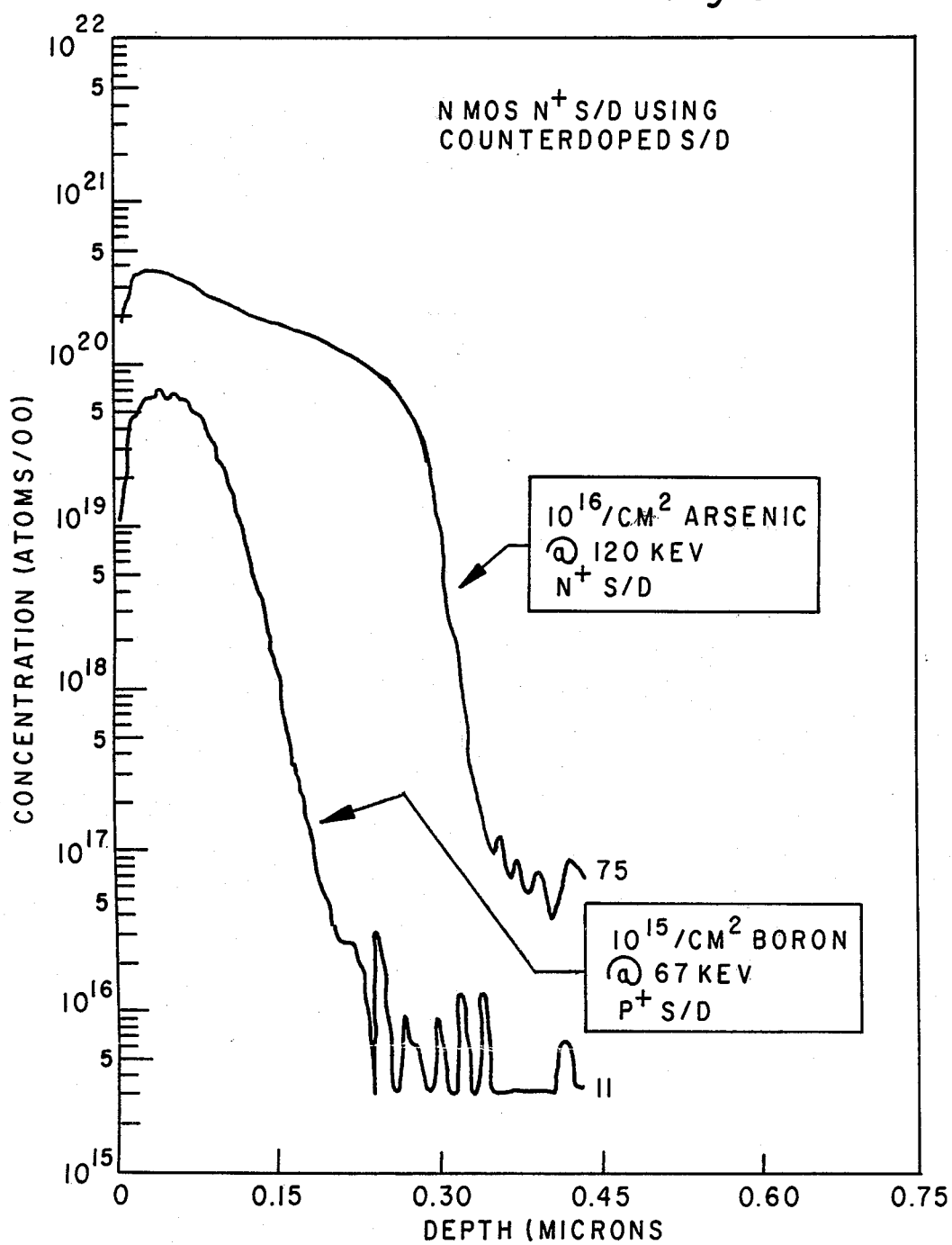
FIG. 3 shows depth profiles of arsenic and boron concentrations within an N-type source/drain region prepared by counterdoping according to the present invention.

FIG. 3 shows characterization results for an N-type source/drain region 18 which was actually prepared using the above techniques. Secondary ion mass spectroscopy was used to prepare a graph of concentration versus depth, for both arsenic and boron. As may be seen, the boron is almost entirely concentrated at depths shallower than 0.15 microns, whereas the arsenic concentration remains heavy down to approximately 0.3 microns. Not only is the arsenic concentration substantially higher than the boron concentration at all depths, but the boron concentration at the N/P junction created by the front of the arsenic diffusion is negligible. (The measurement techniques used prevent measurement of a boron concentration below approximately $4 \times 10^{15}$ per cm$^3$.) Thus, the method of the present invention has served to create a good quality N-type source/drain region 18. Moreover, since the boron diffusion remains totally enclosed by the arsenic diffusion, there is no parasitic DMOS created, and accordingly, no threshold shift.

Figure 4:
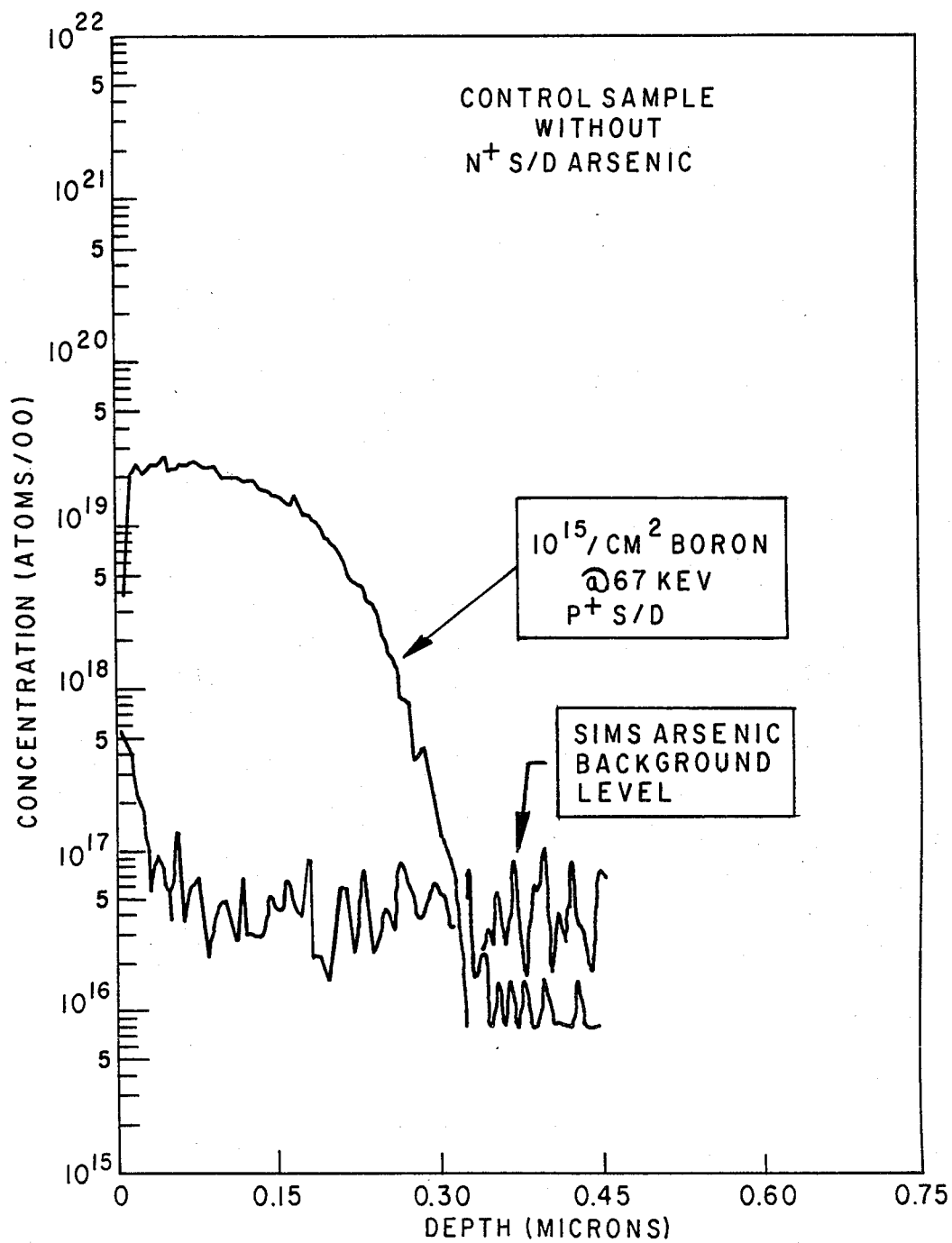
FIG. 4 shows a depth profile of a P-type source/drain region to which only boron implantation and not arsenic implantation has been applied, in accordance with the present invention.

A concentration versus depth profile was also made, using the same measurement techniques, for a region (such as the P-type source/drain regions 16) where only boron has been implanted. As comparison of FIGS. 3 and 4 shows, the same dose of boron, if arsenic is absent, will diffuse down to about 0.3 microns. If a P-type dopant having such a final concentration vs depth profile were used in combination with an N-type dopant having a concentration versus depth profile like that shown for arsenic in FIG. 3, there would therefore be danger of a parasitic DMOS channel being created near 0.3 microns depth, causing variable or undesired device characteristics.

While it is possible to use (e.g.) phosphorus instead of arsenic as an N-type dopant, the absence of the cooperative doping effects experienced between boron and arsenic would make source/drain counterdoping much less attractive. In addition, a further difficulty is that some combinations of dopants have a cooperative effect opposite to that experienced with arsenic and boron, which is most undesirable. For example, where phosphorus and boron are used, there appears to be some tendency for the junction depth of the boron to be increased by the phosphorus dose. (Intuitively, the phosphorus may be imagined as pushing the boron ahead of it.)

Thus, while counterdoping may be practiced with other materials than boron and arsenic, the present invention uses dopants having a cooperative diffusivity interaction like that between boron and arsenic. See, e.g., Ziegler et al, Discovery of Anomalous Base Regions in Transistors, Applied Physics Letters, 1707–1709 (August 1972), which is hereby incorporated by reference. The majority dopant should be applied at a higher dose and higher implant energy than the minority dopant. Preferably the dose and energy will both differ by factors of three to ten. Preferably the dose and implant energy of the majority impurity will be such as to provide a peak concentration after activation of greater than $10^{20}$ per cm$^3$. Thus, by means of the present invention, well-controlled formation of source and drain regions is possible for CMOS devices, and a masking step is saved. In the present invention, a mask 24 is used to selectively expose the N-type source/drain regions 18, but, without the use of the present invention, an additional mask would also be required to selectively expose the P-type source/drain regions 16.

While the presently preferred embodiment implants arsenic first and boron second, the order of implantation of the impurities is believed not to be critical. That is, the boron implant could first be applied both to the regions 18 and to the regions 16, and the mask 24 could then be applied to cover the regions 16. The arsenic implant is then applied to the regions 18 only.

Thus, the present invention permits saving one masking step in the production of any CMOS device, and therefore permits a saving of five to ten percent in the production cost of any CMOS device.

The present disclosure has been most specifically directed to the primary preferred embodiment, wherein both boron and arsenic are used as dopants in silicon, but the concepts of the present invention are also applicable to other dopants and materials, and the scope of the invention is expressly not limited by the scope of the preferred embodiment discussed.

What is claimed is:

1. A method for forming respective CMOS source/drain regions of first and of second conductivity type in respective desired locations in a semiconductor surface, comprising the steps of:

(a) implanting a first-conductivity-type dopant in the respective desired locations of said first-conductivity-type sources and drains; and
    (b) implanting a second-conductivity-type dopant in the respective desired locations both of said first type and of said second type sources and drains, said second-type dopant being applied at a lower dose than said first type dopant;
    said second type dopant being such that the presence of said second-conductivity-type dopant reduces the diffusivity of said first-conductivity-type dopant.

2. The method of claim 1, wherein said semiconductor surface comprises silicon, and wherein said first- and second-type dopants respectively comprise arsenic and boron.

3. The method of claim 1, wherein said second-type implantation is applied at a lower energy than said first-type implantation.

4. The method of claim 1, wherein said first-type implanting step applies said first-type dopant at a dosage and energy such that the maximum concentration of said first-type dopant within said semiconductor surface is made greater thatn $10^{20}$/cm$^3$.

5. The method of claim 1, further comprising the subsequent step of:

forming a metal silicide layer over the respective surface portions of said first-type sources and drains.

6. The method of claim 1, wherein said first-type implanting step is performed before said second-type implanting step.

7. The method of claim 3, wherein said first-type implantation is applied at a dose of at least approximately five times that of said second-type implantation.

8. The method of claim 7, wherein said first-type implantation is applied at an effective energy approximately ten times that of said second-type implantation.

9. The method of claim 8, wherein said first-type dopant is implanted at a dose of $5 \times 10^{15} - 1.5 \times 10^{16}$/cm$^2$; and said second-type dopant is implanted at a dose of $10^{15} - 4 \times 10^{15}$/cm$^2$.

10. The method of claim 9, wherein said first-type implanting step applies As$^{75}$ at a dose of approximately $10^{16}$ per cm$^2$ at an energy of approximately 120 KeV, and said second-type implantating step applies BF$_2$ at a dose of approximately $10^{15}$ per cm$^2$ at an energy of approximately 67 KeV.

* * * * *

UNITED STATES PATENT OFFICE
CERTIFICATE OF CORRECTION

Patent No. 4,406,710       Dated   September 27, 1983

Inventor(s)  Roderick D. Davies and David B. Scott

It is certified that error appears in the above-identified patent and that said Letters Patent are hereby corrected as shown below:

Column 2, line 50, delete "second-type" and insert --first-type--.
Column 2, line 51, delete "first-type" and insert --second-type--.
Column 6, line 10, delete "second-conductivity-type" and insert
    --first-conductivity-type--.
Column 6, line 11, delete "first-conductivity-" and insert
    --second-conductivity- --.

Signed and Sealed this

Thirteenth Day of November 1984

[SEAL]

Attest:

GERALD J. MOSSINGHOFF

Attesting Officer   Commissioner of Patents and Trademarks